United States Patent [19]

Koibuchi et al.

[11] Patent Number: 4,801,519
[45] Date of Patent: Jan. 31, 1989

[54] PROCESS FOR PRODUCING A PATTERN WITH NEGATIVE-TYPE PHOTOSENSITIVE COMPOSITION

[75] Inventors: Shigeru Koibuchi; Asao Isobe, both of Hitachi; Daisuke Makino, Mito; Yutaka Takeda, Ome, all of Japan

[73] Assignees: Hitachi Chemical Company Ltd.; Hitachi, Ltd., both of Tokyo, Japan

[21] Appl. No.: 37,847

[22] Filed: Apr. 13, 1987

Related U.S. Application Data

[63] Continuation of Ser. No. 855,459, Apr. 24, 1986, abandoned.

[51] Int. Cl.$^4$ ................................................. G03C 5/00
[52] U.S. Cl. .................................... 430/331; 252/156; 252/528; 252/529; 252/541; 252/547; 252/548; 430/301; 430/326
[58] Field of Search ..................... 430/331, 309, 326; 252/547, 548, 541, 528, 529, 156

[56] References Cited

U.S. PATENT DOCUMENTS 4,423,138 12/1983 Guild ................................. 430/326
4,556,629 12/1985 Poulin et al. ..................... 430/326 X
4,610,953 9/1986 Hashimoto et al. ............ 430/326 X

FOREIGN PATENT DOCUMENTS 0219743 12/1984 Japan ................................. 430/331

Primary Examiner—Mukund J. Shah
Attorney, Agent, or Firm—Antonelli, Terry & Wands

[57] ABSTRACT

A developing solution comprising at least two compounds selected from choline and quaternary ammonium salts is suitable for developing a negative-type photosensitive resin composition with exposure to a smaller light amount.

9 Claims, No Drawings

PROCESS FOR PRODUCING A PATTERN WITH NEGATIVE-TYPE PHOTOSENSITIVE COMPOSITION

This is a continuation of application Ser. No. 855,459, filed Apr. 24, 1986 abandoned.

BACKGROUND OF THE INVENTION

This invention relates to a developing solution for a negative-type photosensitive composition.

As developing solutions, there have heretofore been used aqueous solutions of sodium hydroxide, potassium hydroxide, sodium carbonate, sodium hydrogencarbonate, tetramethylammonium, trimethylethylolammonium (so-called choline), etc. In particular, aqueous solutions of tetramethylammonium and choline are used in the semiconductor industry because they contain no metal impurity such as sodium or potassium. These compositions are commercially available. The commercial compositions include, for example, RD-2000N DEVELOPER mfd. by Hitachi Chemical Co., Ltd., NMD-3 mfd. by Tokyo Ohka Kogyo Co., Ltd., MF-312 mfd. by Shipley Co. Inc., TMK-12 mfd. by Kanto Chemical Co., Ltd., etc.

These developing solutions are excellent in ability to dissolve coating films, but they are disadvantageous in that when applied to a negative-type photosensitive resin, they dissolve photochemically cured portions, so that unless a larger light exposure is employed, the resin is not cured, resulting in low sensitivity.

SUMMARY OF THE INVENTION

This invention removes the above-mentioned disadvantage, and provides a developing solution capable of giving a pattern at an especially small light exposure as a developing solution for a negative-type photosensitive resin composition.

This invention provides a developing solution for a negative-type photosensitive composition which comprises at least two compounds selected from the group consisting of a compound of the formula: $(CH_3)_3(CH_2CH_2OH)NOH$ and compounds of the formula: $(C_nH_{2n+1})_4NX$ (I)

wherein X is OH, Cl, I or Br; and n is an integer of 1 to 5.

DESCRIPTION OF THE PREFERRED EMBODIMENTS

The compounds of the formula (I) used in this invention include tetramethylammonium hydroxide, tetramethylammonium bromide, tetramethylammonium chloride, tetramethylammonium iodide, tetraethylammonium hydroxide, tetraethylammonium bromide, tetraethylammonium chloride, tetraethylammonium iodide, tetrapropylammonium hydroxide, tetrapropylammonium bromide, tetrapropylammonium iodide, tetrapropylammonium chloride, tetrabutylammonium hydroxide, tetrabutylammonium chloride, tetrabutylammonium bromide, tetrabutylammonium iodide, tetrapentylammonium chloride, tetrapentylammonium iodide, trimethylethylolammonium hydroxide, etc.

These compounds are commercially available as reagents, for example, from Wako Pure Chemical Industries, Ltd., Tokyo Kasei Kogyo Co., Ltd., and Kanto Chemical Co., Ltd.

$(CH_3)_3(CH_2CH_2OH)NOH$ should not necessarily be used, and there are used at least two compounds selected from the group consisting of this compound and the compounds of the above formula (I).

In this case, when a developing solution comprising a combination of two compounds is used, the combination includes combination of tetramethylammonium hydroxide and tetraethylammonium hydroxide, combinations of tetramethylammonium hydroxide and tetrabutylammonium hydroxide, tetrabutylammonium bromide or tetrabutylammonium chloride, combination of tetramethylammonium hydroxide and tetrapentylammonium chloride, combination of tetraethylammonium hydroxide and tetrapentylammonium chloride, combination of choline (structural formula; $(CH_3)_3(CH_2CH_2OH)NOH$) and tetraethylammonium hydroxide, combination of choline and tetrabutylammonium hydroxide, tetrabutylammonium bromide or tetrabutylammonium chloride, combination of choline and tetrapentylammonium chloride, etc. If necessary, it is also possible to mix three compounds.

As to the ratio for mixing two compounds, the ratio of one compound having a lower molecular weight to the other compound having a higher molecular weight is preferably in the weight ratio range of 1:1 to $1:1 \times 10^{-4}$.

Particularly when compounds widely different from each other in molecular weight are used, the resulting developing solution composition has a marked sensitivity-improving effect by virtue of addition of a small amount of a compound having a higher molecular weight.

The developing solution of this invention is used usually in the form of an aqueous solution and/or an alcoholic solution. As the solvent, there can be used water such as deionized water and alcohol such as methanol, ethanol and the like.

As to the amounts of the above-mentioned compounds dissolved in the solvent, the compounds are used in the developing solution usually in a concentration of 10% by weight or less, preferably in the mixing ratio described above.

If necessary, the developing solution of this invention may contain secondary constituents depending on purposes. Examples of the secondary constituents include surface active agents which improve the wettability between the developing solution and photosensitive resins; stabilizers which improves the stability; and the like.

As a negative-type photosensitive composition soluble in aqueous alkali solutions to which the developing solution of this invention is applicable, any one may be used so long as the polymer component in it is soluble in aqueous alkali solutions. Examples of the polymer include novolak resins, polyhydroxystyrene resins, polymers of acrylic acid or methacrylic acid, etc. These are used alone or as a mixture thereof in the form of a homo-condensation product, co-condensation product, homopolymer or copolymer.

These resins are available also commercially. For example, the novolak resins include phenolic novolak, cresylic novolak, phenolic-cresylic novolak, etc. The polyhydroxystyrene resins include poly(p-vinylphenol), bromide of poly(p-vinylphenol), etc. The polymers of acrylic acid or methacrylic acid include acrylic acid or methacrylic acid homopolymers; copolymers of acrylic acid or methacrylic acid and an acrylic ester or methacrylic ester; copolymers of acrylic acid or methacrylic acid and styrene; etc.

The negative-type photosensitive composition soluble in aqueous alkali solutions may be incorporated with a commercial photopolymerization initiator for its action as a negative-type one. Examples of employment of aromatic azide compounds as photopolymerization initiators are shown in Japanese Patent Publication Nos. 22082/70, 26048/69, 34902/78 and 4481/74, etc.

However, when images are formed by using far ultraviolet rays, electron beam, X-rays or the like having higher energy, the photosensitive composition becomes insoluble in the aforesaid developing solution and hence is usable even if no photopolymerization initiator is used.

Examples of negative-type photosensitive compositions soluble in aqueous alkali solutions in which aromatic azide compounds are used as photopolymerization initiators include RD-2000N, RU-1000N and RG-3000N all manufactured by Hitachi Chemical Co., Ltd., etc.

The developing solution of this invention is applied to negative-type photosensitive compositions soluble in aqueous alkali solutions, is characterized in that it permits formation of images at a small light exposure, and is advantageous in that the productivity can be further improved.

In addition, the developing solution of this invention can be widely used in the fields of photographic industry, printing industry, electronics industry, etc.

This invention is illustrated below by way of Examples.

EXAMPLE 1

A developing solution was prepared by adding 0.01 g of tetrabutylammonium hydroxide (mfd. by Tokyo Kasei Kogyo Co., Ltd.) to 100 g of a 1.5% aqueous solution of tetramethylammonium hydroxide (mfd. by Wako Pure Chemical Industries, Ltd.).

As a photosensitive composition, RU-1000N mfd. by Hitachi Chemical Co., Ltd. was used. It was spin-coated on a silicon wafer at 5,000 r.p.m. for 30 seconds and dried at 80° C. for 20 minutes to obtain a photosensitive film of 1 μm in thickness.

Subsequently, by means of a 250 W mercury lamp (an exposure apparatus MA-10 mfd. by Mikasa Co., Ltd.), the coating film was cured by changing an exposure time. the film was then developed with the above-mentioned developing solution at 23° C. for 65 seconds to find that the exposure time required for leaving a cured film (0.5 μm) having one-half the thickness of the coating film was 3 seconds.

COMPARATIVE EXAMPLE 1

There was used the same developing solution as in Example 1, except that no tetrabutylammonium hydroxide was added. By use of the same photosensitive composition as in Example 1, a photosensitive film was formed in the same manner as in Example 1. The coating film was cured by means of the same mercury lamp as in Example 1. The film was then developed with the above-mentioned developing solution at 23° C. for 25 seconds to find that the time required for leaving a cured film having one-half the thickness of the coating film was 50 seconds.

EXAMPLES 2 TO 8

By use of the same photosensitive composition as in Example 1, a photosensitive film was formed in the same manner as in Example 1. The coating film was cured by means of the same mercury lamp as in Example 1. The exposure time required for leaving a cured film having one-half the thickness of the coating film after each predetermined development was determined and is shown in Table 1.

COMPARATIVE EXAMPLE 2

When a 3% aqueous solution of tetraethylammonium hydroxide was used alone as a developing solution, the exposure time required for leaving a cured film having one-half the thickness of coating film was 30 seconds.

EXAMPLES 9 TO 17

As a photosensitive composition, RG-3000N mfd. by Hitachi Chemical Co., Ltd. was used. It was spin-coated on a silicon wafer at 5,000 r.p.m. for 30 seconds and dried at 80° C. for 20 minutes to obtain a photosensitive film of 1 μm in thickness.

Subsequently, the coating film was cured for various exposure times through a VY-43 filter (mfd. by Toshiba Glass Co., Ltd.), which was used for cutting off light having a wavelength shorter than 405 nm in order to conduct exposure to light having a wavelength of 436 nm.

Thereafter, the film was developed with each predetermined developing solution, and the exposure time required for leaving a cured film having one-half the thickness of the coating film was determined and is shown in Table 1.

COMPARATIVE EXAMPLE 3

The composition in Example 9 was developed with the same developing solution as in Comparative Example 1 to find that the exposure time required for leaving a cured film having one-half the thickness of coating film was 400 seconds.

TABLE 1

| | Solute (I) | | Solute (II) | | Photosensitive composition | Exposure time required for curing one-half of coating film (sec) |
|---|---|---|---|---|---|---|
| Example 1 | $(CH_3)_4NOH$ (1.5%) aq. solution | 100 g | $(C_4H_9)_4NOH$ | 0.01 g | RU-1000N | 3 |
| Comparative Example 1 | $(CH_3)_4NOH$ (1.5%) aq. solution | 100 g | None | | RU-1000N | 50 |
| Example 2 | $(CH_3)_4NOH$ (1.5%) aq. solution | 100 g | $(C_4H_9)_4NOH$ | 0.03 g | RU-1000N | 2 |
| Example 3 | $(C_2H_5)_4NOH$ (3%) aq. solution | 100 g | $(C_4H_9)_4NOH$ | 0.1 g | RU-1000N | 10 |
| Comparative Example 2 | $(C_2H_5)_4NOH$ (3%) aq. solution | 100 g | None | | RU-1000N | 30 |
| Example 4 | $(CH_3)_4NOH$ (1.5%) aq. solution | 100 g | $(C_5H_{11})_4NCl$ | 0.003 g | RU-1000N | 2 |
| Example 5 | $(CH_3)_4NOH$ (1.5%) aq. solution | 100 g | $(C_4H_9)_4NBr$ | 0.03 g | RU-1000N | 2 |
| Example 6 | $(CH_3)_4NOH$ (1.5%) aq. solution | 100 g | $(C_4H_9)_4NCl$ | 0.03 g | RU-1000N | 2 |

TABLE 1-continued

| | Solute (I) | Solute (II) | Photosensitive composition | Exposure time required for curing one-half of coating film (sec) |
|---|---|---|---|---|
| Example 7 | $(CH_3)_4NOH$ (1.5%) aq. solution | 100 g $(C_2H_5)_4NOH$ 0.1 g | RU-1000N | 20 |
| Example 8 | $(CH_3)_4NOH$ (2.0%) aq. solution | 100 g $(C_5H_{11})_4NCl$ 0.01 g | RU-1000N | 1.5 |
| Example 9 | The same as in Example 1 | 100 g The same as in Example 1 | RG-3000N | 100 |
| Example 10 | The same as in Example 2 | 100 g The same as in Example 2 | RG-3000N | 90 |
| Example 11 | The same as in Example 3 | 100 g The same as in Example 3 | RG-3000N | 130 |
| Example 12 | The same as in Example 4 | 100 g The same as in Example 4 | RG-3000N | 40 |
| Example 13 | The same as in Example 5 | 100 g The same as in Example 5 | RG-3000N | 80 |
| Example 14 | The same as in Example 6 | 100 g The same as in Example 6 | RG-3000N | 80 |
| Example 15 | The same as in Example 7 | 100 g The same as in Example 7 | RG-3000N | 250 |
| Example 16 | The same as in Example 8 | 100 g The same as in Example 8 | RG-3000N | 20 |
| Example 17 | Choline (1.5%) aq. solution | 100 g $(C_5H_{11})_4NCl$ 0.003 g | RG-3000N | 50 |
| Comparative Example 3 | $(CH_3)_4NOH$ (1.5%) aq. solution | 100 g None | RG-3000N | 400 |

What is claimed is:

1. A process for producing a pattern with a negative-type photosensitive composition which comprises coating a negative-type photosensitive composition on a semiconductor substrate; drying the coating to provide a photosensitive film; subjecting the film to small light exposure to effect curing of selected portions thereof; and developing the film by contacting with a developing solution which comprises at least two compounds selected from the group consisting of a compound of the formula:

$$(CH_3)_3(CH_2CH_2OH)NOH$$

and compounds of the formula:

$$(C_nH_{2n+1})_4NX \qquad (I)$$

wherein X is OH, Cl, I or Br; and n is an integer of 1 to 5.

2. A process according to claim 1, wherein the exposure time required for curing one-half of the coating film with said developing solution is ½ or less and preferably ¼ or less the time required by another developing solution containing only one of said compounds.

3. A process according to claim 1, wherein said at least two compounds comprise a first compound and a second compound, said first compound having a smaller molecular weight than the second compound, and wherein the weight ratio of said first compound to said second compound is in the range of 1:1 to $1:1 \times 10^{-4}$.

4. A process according to claim 1, wherein said developing solution further comprises a solvent selected from the group consisting of water and alcohol.

5. A process according to claim 1, wherein said at least two compounds are a combination of tetramethylammonium hydroxide and tetrapentylammonium chloride.

6. A process according to claim 1, wherein said at least two compounds are a combination of choline and tetrapentylammonium chloride.

7. A process according to claim 4, wherein said at least two compounds are dissolved in said solvent at a concentration of 10% by weight or less.

8. A process according to claim 4, wherein said developing solution further comprises surface active agents and stabilizers.

9. A process according to claim 1, wherein said negative-type photosensitive composition comprises a polymer component soluble in aqueous alkali solutions and a photopolymerization initiator comprising an aromatic azide compound.

* * * * *